ELECTRONIC AMPLIFIER TECHNIQUES

Original Filed Oct. 23, 1965

INVENTOR.

ROBERT H. RUSSELL,

BY HIS ATTORNEYS

Spensley & Horn

United States Patent Office 3,529,255
Patented Sept. 15, 1970

3,529,255

ELECTRONIC AMPLIFIER TECHNIQUES

Robert H. Russell, Altadena, Calif., assignor, by mesne assignments, to Dynasciences Corporation, Blue Bell, Pa., a corporation of Pennsylvania Continuation of application Ser. No. 504,009, Oct. 23, 1965. This application July 25, 1968, Ser. No. 751,673
Int. Cl. H03f 3/04, 3/26
U.S. Cl. 330—15 4 Claims

ABSTRACT OF THE DISCLOSURE

The technique of minimizing quiescent power consumption of Class A push-pull amplifiers in unidirectional output signal applications by setting the quiescent current of the amplifying element the conduction of which is enhanced under normal signal conditions, to a value not in excess of about one-fifth the maximum load current.

BACKGROUND OF THE INVENTION

This application is a continuation of copending application Ser. No. 504,009, now abandoned.

The basic push-pull amplifier circuit has long been used for voltage amplifiers working into a balanced load. However, such amplifier stages when operated in class A draw a significant amount of current under no-signal input conditions. The present invention is directed toward a technique for providing a push-pull amplifier function with a minimum standing power consumption in applications using a unidirectional output signal. Class A push-pull amplifier stages are usually adjusted so that the current drawn by each of the two transistors, or other electrical translating elements used as amplifying devices, is somewhat greater than the load current under maximum signal input conditions. Thus, the quiescent current is usually more than twice the maximum load current.

SUMMARY OF THE INVENTION

The present invention technique comprises adjusting the quiescent current of the transistor, the conduction of which is enhanced under normal signal conditions, to a value not in excess of about ⅕ of the maximum load current, the quiescent current of the other transistor, the conduction of which is reduced under normal signal conditions, remaining at the usual value of slightly greater than the maximum load current, thereby significantly reducing the stage quiescent current. When adjusted in this manner the stage operates as a differential amplifier adjusted for zero output voltage under no-signal input conditions.

Accordingly, it is an object of the present invention to provide improved electronic amplifier techniques.

It is also an object of the present invention to provide improved electronic amplifier circuitry.

It is another object of the present invention to provide an improved technique for achieving a unidirectional push-pull amplifier function.

It is a further object of the present invention to provide a technique for operating a push-pull amplifier stage as a differential amplifier.

It is still another object of the present invention to provide an improved amplifier circuit for applications using a unidirectional input signal.

It is a still further object of the present invention to provide a technique for achieving a unidirectional push-pull amplifier function with a significantly reduced standing power consumption.

The novel features which are believed to be characteristic of the invention, both as to its organization and method of operation, together with further objects and advantages thereof will be better understood from the following description considered in connection with the accompanying drawing which illustrates the application of the present invention technique by way of example.

DESCRIPTION OF THE PREFERRED EMBODIMENT

Figure 1:
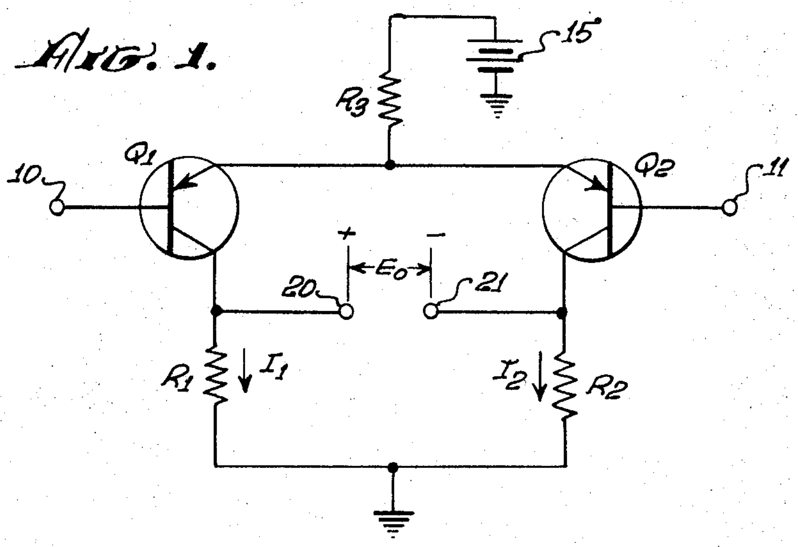
FIG. 1 is a schematic diagram of an amplifier circuit with current flow paths indicated for no-signal input conditions; and, FIG. 2 shows the circuit of FIG. 1 with the current paths labeled for maximum output load and signal input conditions.
Figure 2:
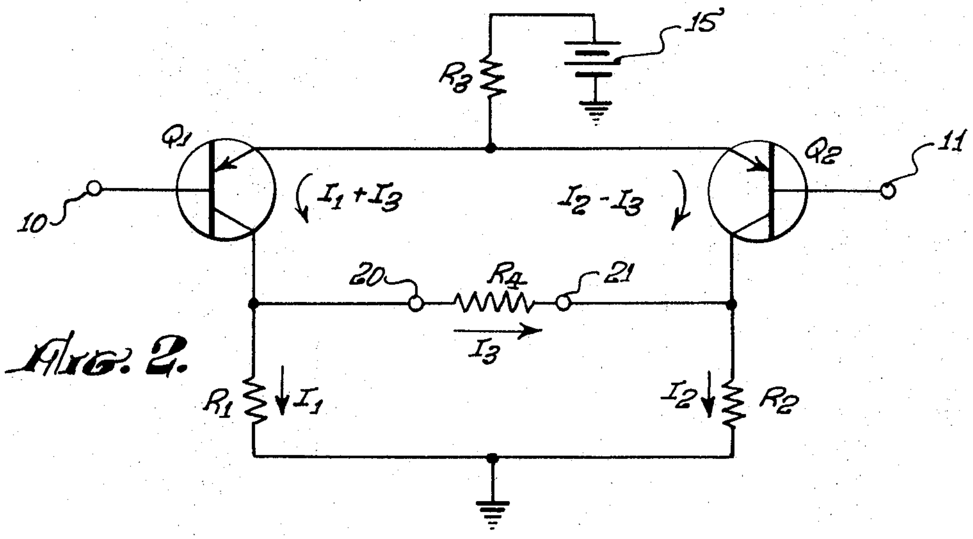

Turning now to the drawing, in FIGS. 1 and 2 there are shown simplified schematic diagrams of a transistorized push-pull amplifier stage, together with indications of the current flow through the various parts of the circuit, under different operating conditions.

The electrical translating elements utilized in the amplifier stage are transistors $Q_1$ and $Q_2$, although it is to be understood that the present invention techniques are equally applicable to other types of electrical translating elements, such as vacuum tubes, for example. Signal input to the base of the transistor $Q_1$ is applied through a signal input terminal 10, the signal input to the base of transistor $Q_2$ being applied through a signal input terminal 11. Under the stated condition of unidirectional output, equivalent to class A operation, it is apparent that the current flow through the same transistor will always increase upon the application of a normal input signal, while the current flow through the other transistor will always decrease. In the drawings, $Q_1$ is specified as the enhanced conduction transistor and $Q_2$ as the reduced conduction transistor.

Both of the transistors $Q_1$ and $Q_2$ are of the same conductivity type, PNP type transistors being shown.. The emitters 12*a* and 12*b* of the transistors $Q_1$ and $Q_2$ are connected through a resistor $R_3$ to the positive terminal of a source of D.C. operating potential, such as a battery 15. The negative terminal of the battery 15 is connected to a point of common potential, ground being indicated in the drawings. A load resistor $R_1$ is connected between the collector 13*a* of the transistor $Q_1$ and ground, while a load resistor $R_2$ is connected between the collector 13*b* of the transistor $Q_2$ and ground. The amplifier output voltage is taken from between a pair of signal output terminals 20 and 21, the output terminal 20 being connected to the collector 13*a* of the transistor $Q_1$ and the output terminal 21 being connected to the collector 13*b* of the transistor $Q_2$. In FIG. 1 of the drawing the output voltage is indicated as $E_0$.

Collector current flow through the transistor $Q_1$ flows through the load resistor $R_1$ and is vectorially indicated in the drawings as $I_1$. The collector current flow through the transistor $Q_2$ flows through the load resistor $R_2$ and is vectorially indicated as $I_2$. When adjusting this stage in accordance with the usual prior art practice, $I_1$ is set equal to $I_2$ under no-signal input conditions. That is, the transistors $Q_1$ and $Q_2$ are normally operated with balanced quiescent collector currents, the current through each of the load resistors $R_1$ and $R_2$ being equal at zero output ($E_0=0$). The transistors thus become unbalanced as the output voltage is developed in response to an input voltage. Under normal signal conditions the current through the transistor $Q_1$ will increase while the current through the transistor $Q_2$ will decrease, so that each collector voltage moves an approximately equal but opposite amount. The collector current through the transistor $Q_2$ must always be greater than the maximum load current to be supplied so that this transistor will still be in conduction when the output is fully loaded. This is apparent because the current through the transistor $Q_2$ becomes reduced by the amount of the current flowing in the external load, and also because of the reduction in potential drop across the load resistor $R_2$.

FIG. 2 of the drawing shows the stage under load conditions, and with an external load resistance $R_4$ being connected across the output terminals 20 and 21. The external load current is vectorially indicated as $I_3$. A study of the circuitry will show that the current through the transistor $Q_1$ under signal input conditions is the sum of the currents flowing through the resistors $R_1$ and $R_4$ and will therefore be equal to $I_1+I_3$, noting that $I_1$ under applied signal conditions is greater than $I_1$ under no signal input conditions. The current flow through the transistor mum load the transistor $Q_1$ carries very heavy current. flowing through the resistor $R_2$ decreased by the load current $I_3$, i.e., $I_2-I_3$. It is thus readily apparent that the transistor $Q_1$ never carries a current approaching that of the transistor $Q_2$, except at zero output, and that at maximum load the tansistor $Q_1$ carries very heavy current. More specifically, the minimum current of the transistor $Q_1$ is the minimum value of $I_1$, and the maximum current of that transistor is $I_1+I_3$. Thus, there is a component of current always present in the transistor $Q_1$, which component may be removed without affecting proper device operation, thereby enabling a substantial reduction in the total load current drawn by the amplifier when designed for supplying a given unidirectional load current.

The current flow through the transistor $Q_2$ ranges from a maximum of $I_2$, under no-signal conditions, to a minimum of $I_2-I_3$ under signal input conditions for a load current $I_3$. For a given situation wherein the load current $I_3$ is set equal to 100 units, it is apparent that the quiescent current flow, $I_2$, through the transistor $Q_2$ must be in excess of 100 units. In accordance with typical prior art practice the resistors $R_1$ and $R_2$ are substantially equal and adjusted so that the quiescent current through each of the transistors $Q_1$ and $Q_2$ is about 110 units. Thus, the stage draws 220 units of output current under quiescent conditions when designed to supply 100 units of output current. Yet, for normal transistor operation under the stated condition of unidirectional input signals, it is required only that the transistors $Q_1$ and $Q_2$ will always pass current in the normal direction.

The present invention technique is to readjust the quiescent current conditions to a condition of drastic imbalance, wherein the quiescent collector current of the transistor $Q_1$ will not be in excess of about ⅕ of the maximum load current. Thus, for the hereinabove described example wherein it is desired to supply 100 units of load current, the resistance of $R_1$ is increased in value to reduce the collector current through the transistor $Q_1$, under no-signal conditions, to a typical value of 10 units. The resistor $R_2$ is unchanged, so that the quiescent current of the transistor $Q_2$ remains at 110 units. Typical resistance values for the resistors $R_1$ and $R_2$ are respectively 100,000 ohms and 10,000 ohms. Now, it is seen that the total quiescent current of the stage is 10+110=120 units, a reduction of approximately 48% from the quiescent current flow of the stage when adjusted for operation in accordance with the prior art practice wherein the quiescent currents through each of the transistors $Q_1$ and $Q_2$ are made equal at about 110 units.

In practice, it is only necessary to set the maximum and minimum currents of the two transistors to be just enough to ensure normal class A operation.

The exact ratio of the quiescent currents of the two transistors is not critical, although it has been found unnecessary to set the quiescent current of the enhanced conduction transistor at about more than about ⅕ of the maximum load current. Note that in accordance with the present invention technique both of the transistors $Q_1$ and $Q_2$ carry maximum currents of the same order, whereas in accordance with the usual prior art method of adjustment the transistor $Q_1$ carries a maximum current almost double that of the transistor $Q_2$.

Although the present invention has been described with a certain degree of particularity, it is understood that the present disclosure has been made only by way of example and that numerous changes in the details of the circuitry with which the present invention technique can be utilized may be resorted to without departing from the spirit and scope of the invention as hereinafter claimed. For example, NPN type transistors can be substituted for the PNP type illustrated, accompanied by reversal of the supply voltage polarity.

I claim:

1. In an electronic unidirectional amplifier stage which produces a predetermined maximum load current upon the application thereto of predetermined input signals, said amplifier stage including first and second electronic valves intercoupled in a push-pull amplifier configuration with a load coupled between said first and second electrical translating elements and wherein the current flow through said first electronic valve increases and the current flow through said second electronic valve decreases upon application of said predetermined input signals, means for biasing said first electronic valve to a quiescent current flow not in excess of one-fifth of said maximum load current, and means for biasing said second electronic valve to a quiescent current flow at least slightly greater than said maximum load current.

2. The apparatus of claim 1, wherein said biasing means are self-biasing means.

3. In an electronic unidirectional amplifier stage which produces a predetermined maximum load current upon the application thereto of predetermined input signals, said amplifier stage including first and second electronic valves, each having an input electrode, a control electrode and an output electrode, said input electrodes being connected to common point, and a resistive impedance connected to said common point, a first resistive impedance connected in series with the output electrode of said first electronic valve and a second resistive impedance connected in series to the output electrode of said second electronic valve, and further comprising a load coupled between said output electrodes of said first and second electronic valves, the improvement comprising the ratio of said second resistive impedance to said first resistive impedance being at least five to one.

4. In an electronic unidirectional amplifier stage as set forth in claim 3, said electronic valves being transistors of the same conductivity type, and the said ratio being approximately ten to one.

References Cited

UNITED STATES PATENTS 3,323,070 5/1967 Hayes -------------- 330—30

OTHER REFERENCES

Hoffait and Thornton, "Limitations of Transistor Amplifiers," Proceedings of the IEEE, pp. 179–184, February 1964.

ROY LAKE, Primary Examiner

L. J. DAHL, Assistant Examiner

U.S. Cl. X.R.

330—22, 30

UNITED STATES PATENT OFFICE

CERTIFICATE OF CORRECTION

Patent No. 3,529,255 -- September 15, 1970

Robert H. Russell

It is certified that error appears in the above identified patent and that said Letters Patent are hereby corrected as shown below:

Column 3, line 18, "mum load the transistor $Q_1$ carries vary heavy current." should read -- $Q_2$ under signal conditions will be equal to the current --; line 23, "tansistor" should read -- transistor --.

Signed and sealed this 16th day of February 1971.

(SEAL)
Attest:

Edward M. Fletcher, Jr.
Attesting Officer

WILLIAM E. SCHUYLER, JR.
Commissioner of Patents